US012751037B2

(12) United States Patent
Kim et al.

(10) Patent No.: US 12,751,037 B2
(45) Date of Patent: Sep. 29, 2026

(54) MONOLITHIC FIELD-EFFECT TRANSISTOR-ANTENNA DEVICE FOR TERAHERTZ WAVE DETECTION WITH INDEPENDENT PERFORMANCE PARAMETERS

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Min Woo Ryu, Ulsan (KR); E San Jang, Ulsan (KR); Ramesh Patel, Ulsan (KR); Sang Hyo Ahn, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 1015 days.

(21) Appl. No.: 17/675,628

(22) Filed: Feb. 18, 2022

(65) Prior Publication Data

US 2022/0416074 A1 Dec. 29, 2022

(30) Foreign Application Priority Data

Jun. 24, 2021 (KR) ........................ 10-2021-0082531

(51) Int. Cl.
*H10D 30/60* (2025.01)
*H01Q 1/22* (2006.01)
(Continued)

(52) U.S. Cl.
CPC ........... *H10D 30/60* (2025.01); *H01Q 1/2283* (2013.01); *H01Q 7/00* (2013.01); *H10D 30/0221* (2025.01);
(Continued)

(58) Field of Classification Search
CPC ............. H01L 29/0692; H01L 29/0847; H01L 29/1033; H01L 29/42376; H01L 29/4238;
(Continued)

(56) References Cited

U.S. PATENT DOCUMENTS

| | | | | |
|---|---|---|---|---|
| 2005/0092985 | A1 * | 5/2005 | Hovel | H01L 29/78648 438/18 |
| 2017/0358840 | A1 * | 12/2017 | Kim | H01L 29/7835 |
| 2018/0122912 | A1 * | 5/2018 | Kim | H01L 29/4238 |

FOREIGN PATENT DOCUMENTS

| | | | |
|---|---|---|---|
| JP | 6503093 | B2 | 4/2019 |
| KR | 10-2004-0090223 | A | 10/2004 |
| KR | 10-2013-0133368 | A | 12/2013 |

* cited by examiner

*Primary Examiner* — Leonard Chang
*Assistant Examiner* — Stanetta D Isaac
(74) *Attorney, Agent, or Firm* — Osha Bergman Watanabe & Burton LLP

(57) ABSTRACT

A field-effect transistor for terahertz wave detection using a gate as an antenna includes a silicon substrate including a source and a drain formed outside a channel region surrounding the source, and a gate formed to be spaced apart from the silicon substrate and correspond to the channel region, on a dielectric layer formed on a surface of the silicon substrate, in which the drain has a width determined based on a first performance parameter associated with a terahertz wave reception rate of the field-effect transistor and the channel region has a width determined based on a second performance parameter associated with detection of a terahertz wave to be received by the field-effect transistor.

9 Claims, 5 Drawing Sheets

(51) Int. Cl.

| | |
|---|---|
| ***H01Q 7/00*** | (2006.01) |
| ***H10D 30/01*** | (2025.01) |
| ***H10D 62/10*** | (2025.01) |
| ***H10D 62/13*** | (2025.01) |
| ***H10D 62/17*** | (2025.01) |
| ***H10D 64/27*** | (2025.01) |

(52) U.S. Cl.
CPC ......... *H10D 62/126* (2025.01); *H10D 62/151* (2025.01); *H10D 62/235* (2025.01); *H10D 64/518* (2025.01)

(58) Field of Classification Search
CPC ............... H01L 29/66659; H01L 29/78; H01L 27/0629–0635; H01L 27/0711–0738; H01Q 1/2283; H01Q 7/00; G01N 27/414; H10D 62/126; H10D 62/151; H10D 62/235; H10D 30/60; H10D 30/0221; H10D 30/021; H10D 64/518; H10D 64/519; H10D 64/517; H10F 30/2863
See application file for complete search history.

MONOLITHIC FIELD-EFFECT TRANSISTOR-ANTENNA DEVICE FOR TERAHERTZ WAVE DETECTION WITH INDEPENDENT PERFORMANCE PARAMETERS

CROSS-REFERENCE TO RELATED APPLICATION

This application claims the benefit of Korean Patent Application No. 10-2021-0082531 filed on Jun. 24, 2021, in the Korean Intellectual Property Office, the entire disclosure of which is incorporated herein by reference for all purposes.

BACKGROUND

1. Technical Field

One or more example embodiments relate to a monolithic field-effect transistor-antenna device for terahertz wave detection with independent performance parameters.

2. Description of Related Art

A relatively large-sized antenna may be required at an input end to receive terahertz waves due to an extremely small channel area of a field-effect transistor compared to a sub-millimeter wavelength of the terahertz waves. In this case, a characteristic difference may occur due to a size difference between the antenna and the field-effect transistor, and thus a structure of the antenna and the field-effect transistor may need to be designed.

In the case of a terahertz wave detector based on the field-effect transistor, a gate among three connecting terminals—a source, a drain, and a gate—of the field-effect transistor may receive a terahertz (THz) wave which is an alternating current (AC) signal. In addition, the terahertz wave detector based on the field-effect transistor may induce charge asymmetry into a lower semiconductor channel region between the source and the drain, and detect a terahertz wave signal based on a direct current (DC) voltage of the drain which is an output terminal by an asymmetrical charge distribution.

SUMMARY

According to an aspect, there is provided a field-effect transistor for terahertz wave detection using a gate as an antenna, the field-effect transistor including a silicon substrate including a source and a drain formed outside a channel region provided in a form surrounding the source, and a gate formed to be spaced apart from the silicon substrate and correspond to the channel region, on a dielectric layer formed on a surface of the silicon substrate. The drain may have a width determined based on a first performance parameter associated with a terahertz wave reception rate of the field-effect transistor, and the channel region may have a width determined based on a second performance parameter associated with detection of a terahertz wave to be received by the field-effect transistor.

When viewed in a direction vertical to the silicon substrate, the source may be in a circular form, the channel region may be in a ring form, and the drain may be in a ring form.

When viewed in the direction vertical to the silicon substrate, the gate may be formed to cover the channel region.

A center of the source and a center of the channel region may be separate from each other.

The width of the channel region may be a length equal to a shortest distance from the source to the drain.

The width of the drain may be a length corresponding to one of a target wavelength corresponding to a target terahertz wave of the field-effect transistor, ½ of the target wavelength, and ¼ of the target wavelength.

The width of the channel region may be determined based on a width of the source and a width of the gate.

The width of the channel region may be a length exceeding a length of a charge density distribution generated in response to application of a terahertz wave to the field-effect transistor.

The width of the drain may be determined based on the first performance parameter, and the width of the channel region may be determined only by the second performance parameter independently of the first performance parameter.

When viewed in the direction vertical to the silicon substrate, the gate may partially overlap the source.

When viewed in the direction vertical to the silicon substrate, the gate may partially overlap the drain.

According to another aspect, there is provided a method of manufacturing a field-effect transistor for terahertz wave detection using a gate as an antenna, the method including forming a source by doping a portion of a silicon substrate, and forming a drain by doping an outside of a channel region provided in a form surrounding the source such that the drain has a width determined based on a first performance parameter associated with a terahertz wave reception rate of the field-effect transistor, and forming a gate to be spaced apart from the silicon substrate and correspond to the channel region, on a dielectric layer formed on a surface of the silicon substrate. The channel region may have a width determined based on a second performance parameter associated with detection of a terahertz wave to be received by the field-effect transistor.

When viewed in a direction vertical to the silicon substrate, the source may be in a circular form, the channel region may be in a ring form, and the drain may be in a ring form.

The forming of the gate may include forming the gate to cover the channel region when viewed in the direction vertical to the silicon substrate.

The forming of the drain may include forming a center of the source and a center of the channel region to be separate from each other.

The width of the channel region may be a length equal to a shortest distance from the source to the drain.

The width of the drain may be a length corresponding to one of a target wavelength corresponding to a target terahertz wave of the field-effect transistor, ½ of the target wavelength, and ¼ of the target wavelength.

The width of the channel region may be determined based on a width of the source and a width of the gate.

The width of the channel region may be a length exceeding a length of a charge density distribution generated in response to application of a terahertz wave to the field-effect transistor.

The width of the drain may be determined based on the first performance parameter, and the width of the channel region may be determined only by the second performance parameter independently of the first performance parameter.

The forming of the gate may include forming the gate to partially overlap the source when viewed in the direction vertical to the silicon substrate.

The forming of the gate may include forming the gate to partially overlap the drain when viewed in the direction vertical to the silicon substrate.

Additional aspects of example embodiments will be set forth in part in the description which follows and, in part, will be apparent from the description, or may be learned by practice of the disclosure.

According to example embodiments described herein, a field-effect transistor for terahertz wave detection using a metal gate as an antenna may have a monolithic (or integral) field-effect transistor-antenna structure that receives a terahertz wave using the gate as the antenna without a separate antenna structure and detects the terahertz wave by converting the terahertz wave into a direct current (DC) output voltage.

The field-effect transistor for terahertz wave detection using the metal gate as the antenna may increase a reception rate of a terahertz wave in a desirable detection wavelength range as a drain thereof has a width determined based on a first performance parameter, and may maximize an output voltage for terahertz wave detection as a channel region thereof has a width determined based on a second performance parameter. Thus, the field-effect transistor may increase sensitivity to a terahertz wave based on the width of the drain and the width of the channel region.

In addition, in the field-effect transistor, the width of the drain may be determined based on the first performance parameter, and the width of the channel region may be determined only by the second performance parameter independently of the first performance parameter.

BRIEF DESCRIPTION OF THE DRAWINGS

These and/or other aspects, features, and advantages of the present disclosure will become apparent and more readily appreciated from the following description of example embodiments, taken in conjunction with the accompanying drawings of which.

DETAILED DESCRIPTION

Figure 1:
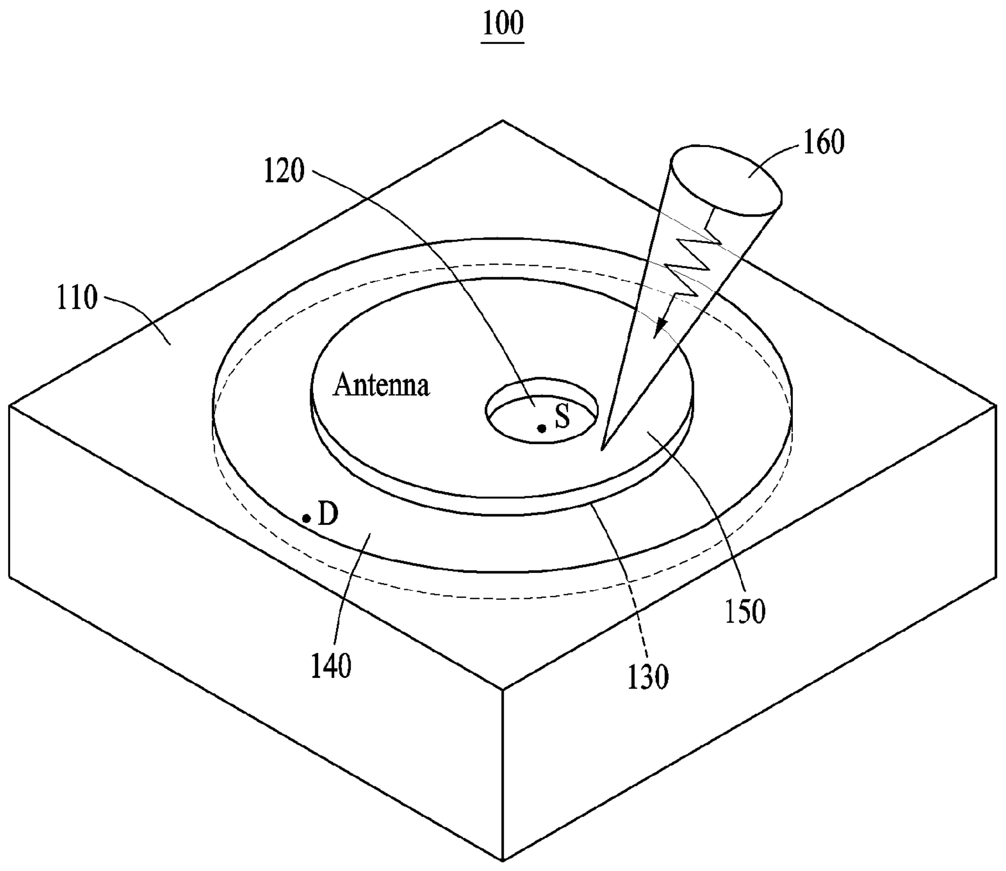
FIG. 1 is a perspective view of a field-effect transistor for terahertz wave detection using a metal gate as an antenna according to an example embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments. Hereinafter, examples will be described in detail with reference to the accompanying drawings, and like reference numerals in the drawings refer to like elements throughout.

A field-effect transistor-based terahertz wave detector may operate in a non-resonant mode by a relatively low mobility of electrons in a channel. Such an operating principle may require an asymmetrical environment between a source and a drain for terahertz wave detection through a voltage difference between the source and the drain.

An existing method may detect a terahertz wave using an output voltage by a potential difference between the source and the drain in the asymmetrical environment using an additional circuit-level design. However, due to this additional component, the existing method may increase a total amount of noise in an entire terahertz wave detector system. Thus, the existing method may not be desirable for the improvement of performance indicators (e.g., Rv and NEP)

of the terahertz wave detector. Equations 1 and 2 below represent the performance indicators Rv and NEP of the terahertz wave detector.

$$Rv = \frac{\text{Output voltage of drain}}{\text{Power of absorbed terahertz wave}} \quad \text{[Equation 1]}$$

$$NEP = \frac{\text{Total noise of terahertz wave detector}}{Rv} \quad \text{[Equation 2]}$$

That is, while using a method of increasing Rv to reduce NEP, the total noise of the detector may need to be maintained or reduced. To increase the sensitivity to terahertz waves, charges of a channel may need to be collected in a two-dimensional (2D) form by a field effect of a gate along with an antenna structure for effectively absorbing the terahertz waves. To this end, an asymmetrical source-drain environment may be required for terahertz wave detection. For the asymmetrical source-drain environment, a structural asymmetry inside the field-effect transistor was designed. However, there was an issue of matching with the field-effect transistor for the operation efficiency of an antenna integrated for a high reactivity.

An existing terahertz wave detector may be manufactured by combining an antenna, a field-effect transistor, and an amplifier, and manufactured to have a size less than a micrometer (μm). Thus, the existing terahertz wave detector may require a relatively extremely large antenna due to an extremely small channel area of the field-effect transistor compared to a wavelength of terahertz waves. Thus, due to an impedance mismatch between a low impedance of the antenna of the large size and a high impedance of the field-effect transistor of the small size, a terahertz wave power transfer loss may occur. Since an output voltage of an extremely small, for example, microvolts (μV) or millivolts (mV), occurs, the terahertz wave detector may necessarily include an amplifier circuit having a large gain of tens of decibels (dB) for amplifying a minute output voltage, which may thereby increase total noise of an entire detector system.

However, according to an example embodiment, a field-effect transistor for terahertz wave detection using a gate as an antenna may have a monolithic (or integral) structure that integrally combines a field-effect transistor configured to convert a terahertz wave into a direct current (DC) output voltage and an antenna configured to receive the terahertz wave. The field-effect transistor may simultaneously have an asymmetrical source-drain structure for maximizing an output voltage and an antenna structure desirable for a wavelength of a target terahertz wave. The target terahertz wave may represent a terahertz wave in a wavelength range to be detected by the field-effect transistor. In the field-effect transistor, a first performance parameter associated with a terahertz wave reception rate may change based on a width of a drain, and a second performance parameter associated with terahertz wave detection may change based on a width of a channel region. Accordingly, the field-effect transistor may increase a reception rate of the target terahertz wave through the drain having the width determined based on the first performance parameter. In addition, the field-effect transistor may maximize an output voltage for terahertz wave detection through the channel region having the width determined based on the second performance parameter independently of the first performance parameter. Hereinafter, a field-effect transistor for terahertz wave detection using a gate as an antenna according to an example embodiment will be described in detail.

FIG. 1 is a perspective view of a field-effect transistor for terahertz wave detection using a metal gate as an antenna according to an example embodiment.

According to an example embodiment, a field-effect transistor 100 for terahertz wave detection using a gate as an antenna (hereinafter simply the field-effect transistor 100) may include a source 120, a channel region 130, and a drain 140 that are formed on a silicon substrate 110, and a gate 150 formed to be spaced apart from the silicon substrate 110. For example, the channel region 130 may be a region including a channel that is a path through which charges move between the drain 140 and the source 120.

Specifically, the field-effect transistor 100 may include the source 120 generated as a portion of the silicon substrate 110 is doped. When the field-effect transistor 100 is viewed in a direction vertical to the silicon substrate 110, the source 120 may be in a circular form.

The field-effect transistor 100 may include the channel region 130 provided in a form surrounding the source 120. When the field-effect transistor 100 is viewed in the direction vertical to the silicon substrate 110, the channel region 130 may be in a ring form (or an annular form). The channel region 130 may have a width determined based on a second performance parameter associated with the detection of a terahertz wave received by the field-effect transistor 100.

The field-effect transistor 100 may include the drain 140 generated as an outside of the channel region 130 is doped. When the field-effect transistor 100 is viewed in the direction vertical to the silicon substrate 110, the drain 140 may be in a ring form or an annular form). The drain 140 may have a width determined based on a first performance parameter associated with a terahertz wave reception rate of the field-effect transistor 100.

The field-effect transistor 100 may include a dielectric layer (not shown) formed on the source 120, the channel region 130, and the drain 140.

The field-effect transistor 100 may include the gate 150 disposed to be spaced apart from the silicon substrate 110 and correspond to the channel region 130, on the dielectric layer formed on the surface of the silicon substrate 110. The gate 150 may be formed to cover the channel region 130 when viewed in the direction vertical to the silicon substrate 110. Additionally, when viewed in the direction vertical to the silicon substrate 110, the gate 150 may be formed to partially overlap the source 120 and partially overlap the drain 140.

The field-effect transistor 100 may receive a terahertz electromagnetic wave 160 through the gate 150. For example, the field-effect transistor 100 may detect a signal of the terahertz electromagnetic wave 160 by a current and voltage generated between the source 120 and the drain 140. In this example, a signal of a terahertz electromagnetic wave may be an electromagnetic wave signal having a frequency between 0.1 terahertz (THz) and 10 THz, and may also be represented as a terahertz wave.

Figure 2:
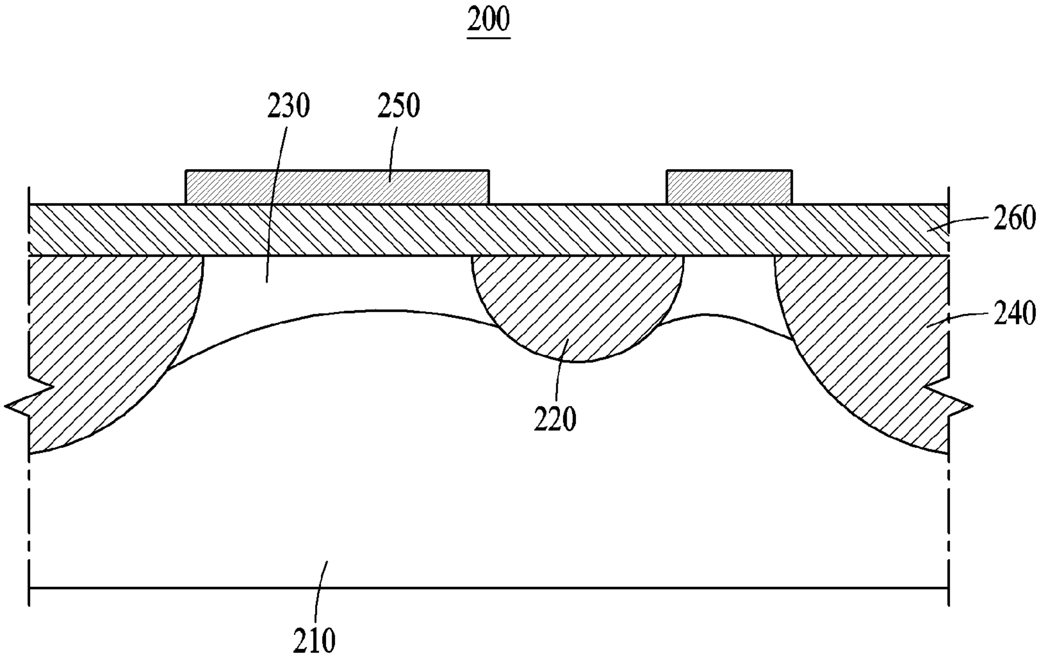
FIG. 2 is a side view of a field-effect transistor according to an example embodiment.

FIG. 2 is a side view of a field-effect transistor according to an example embodiment.

A field-effect transistor 200 may include a silicon substrate 210, a source 220 formed through doping on the silicon substrate 210, a channel region 230 provided in a form surrounding the source 220, a drain 240 formed through doping on an outside of the channel region 230, a dielectric layer 260 formed on a surface of the silicon substrate 210, and a gate 250 formed on the dielectric layer 260 to correspond to the channel region 230.

Figure 3:
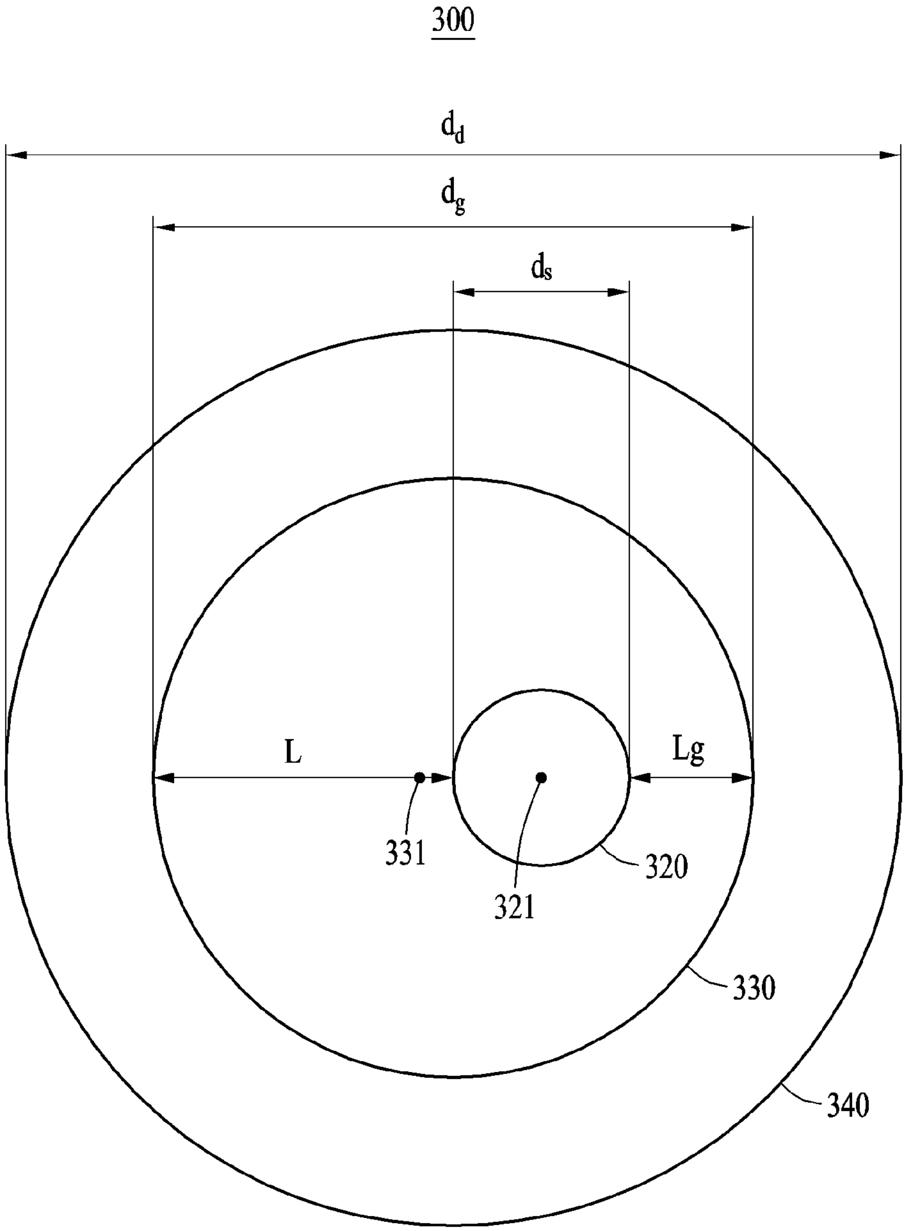
FIG. 3 is a top view of a field-effect transistor according to an example embodiment.

FIG. 3 is a top view of a field-effect transistor according to an example embodiment.

FIG. 3 is a top view obtained by viewing the field-effect transistor 100 of FIG. 1 in a direction vertical to a silicon substrate. Referring to FIG. 3, a field-effect transistor 300 may include a source 320, a channel region 330 surrounding the source 320, and a drain 340 formed outside the channel region 330. The field-effect transistor 300 may further include a gate (not shown) formed to cover the channel region 330 when viewed in a direction vertical to a silicon substrate.

When viewed in the direction vertical to the silicon substrate, the source 320 may be in a circular form, and the channel region 330, the gate, and the drain 340 may each be in an annular form. When viewed in the direction vertical to the silicon substrate, a circumference of the channel region 330 and the gate may be circular, and a circumference of the drain 340 may also be circular.

According to an example embodiment, in the field-effect transistor 300, a center 321 of the source 320 and a center 331 of the channel region 330 may be eccentric. That is, when viewed in the direction vertical to the silicon substrate, the center 321 of the source 320 and the center 331 of the channel region 330 may be separate from each other in the field-effect transistor 300. As the center 321 of the source 320 and the center 331 of the channel region 330 are separate from each other, the field-effect transistor 300 may maximize source-drain asymmetry. The center 331 of the channel region 330 may be a center of a circle corresponding to the circumference of the channel region 330.

Referring to FIG. 3, in the field-effect transistor 300, a width $d_s$ of the source 320 may indicate a diameter $d_s$ of a circle corresponding to the circumference of the source 320. Similarly, a width of the gate may indicate a diameter $d_g$ of a circle corresponding to a circumference of the gate. A width of the drain 340 may indicate a diameter $d_d$ of a circle corresponding to the circumference of the drain 340. In the field-effect transistor 300, a width of the channel region 330 may indicate a length $L_g$ equal to a shortest distance from the source 320 to the drain 340.

For example, when a longest distance from the source 320 to the drain 340 is L, $d_g$ may be equal to a sum of $d_s$, $L_g$, and L.

According to an example embodiment, the field-effect transistor 300 may receive a terahertz wave using the gate as an antenna, and may thus have an antenna effect of the field-effect transistor 300 itself without a separate antenna structure. In addition, the field-effect transistor 300 may detect a terahertz wave received based on an output voltage by a potential difference between the source 320 and the drain 340, using an asymmetrical source-drain structure. The drain 340 of the field-effect transistor 300 may have a width determined based on a first performance parameter associated with a terahertz wave reception rate of the field-effect transistor 300, and channel region 330 may have a width determined based on a second performance parameter associated with the detection of a terahertz wave to be received by the field-effect transistor 300.

The first performance parameter may be an antenna performance parameter associated with a terahertz wave reception rate of a field-effect transistor. The width of the drain 340 of the field-effect transistor 300 may be determined by the first performance parameter. For example, a reception rate of a target terahertz wave to be detected by the field-effect transistor 300 may be associated with the first performance parameter, and the reception rate of the target terahertz wave may increase when the first performance parameter increases. The width (e.g., $d_d$) of the drain 340 may be a length corresponding to one of a target wavelength corresponding to the target terahertz wave of the field-effect transistor 300, ½ of the target wavelength, and ¼ of the target wavelength. Here, a terahertz wave may represent an electromagnetic wave in a frequency range between 0.1 THz and 10 THz, which indicates a wavelength range between 3 millimeters (mm) and 30 micrometers (μm). In the field-effect transistor 300, the reception rate of the target terahertz wave may vary based on the width of the drain 340, and the reception rate of the target terahertz wave may be high when the target wavelength corresponding to the target terahertz wave is in an integer multiple (1×, 2×, 4×, etc.) relationship with the width length of the drain 340.

Further, in the field-effect transistor 300, the width of the drain 340 may be determined based on the first performance parameter associated with the terahertz wave reception rate, and the width (e.g., $L_g$) of the channel region 330 may be independent of the terahertz wave reception rate.

This is because the gate and the source 320 have an insignificant influence on the antenna performance due to a relatively large wavelength of a terahertz wave, and the gate, the source 320, and the drain 340 may operate as a single integral structure when a terahertz wave is applied. Thus, the width of the drain 340 may be determined based on the first performance parameter which is the antenna performance parameter, and the width of the channel region 330 may hardly affect the antenna performance.

The second performance parameter is a performance parameter of a field-effect transistor itself associated with the detection of a terahertz wave to be received by the field-effect transistor. The width $L_g$ of the channel region 330 of the field-effect transistor 300 may be determined by the second performance parameter. When the second performance parameter increases, a detection sensitivity to the target terahertz wave may increase. In the field-effect transistor 300, the width $L_g$ of the channel region 330 may be determined based on the width $d_s$ of the source 320 and the width $d_g$ of the gate. For example, in a state where a distance between the center 321 of the source 320 and the center 331 of the channel region 330 and the width $d_g$ of the gate are predetermined, the width $L_g$ of the channel region 330 may increase when the width $d_s$ of the source 320 decreases. For another example, in a state where the distance between the center 321 of the source 320 and the center 331 of the channel region 330 and the width $d_s$ of the source 320 are predetermined, the width $L_g$ of the channel region 330 may increase when the width $d_g$ of the gate increases. That is, in the field-effect transistor 300, the width $L_g$ of the channel region 330 may be determined based on the second performance parameter which is the performance parameter of the field-effect transistor 300 itself associated with terahertz wave detection, and the width $L_g$ of the channel region 330 may be determined based on the width $d_s$ of the source 320 and the width $d_g$ of the gate. According to an example embodiment, in the field-effect transistor 300, the width of the channel region 330 may be determined based on the second performance parameter associated with terahertz wave detection, and the width of the drain 340 may be independent of an output voltage for the terahertz wave detection. Hereinafter, a process of detecting a received terahertz wave as a DC voltage by a field-effect transistor will be described in detail.

Figure 4:
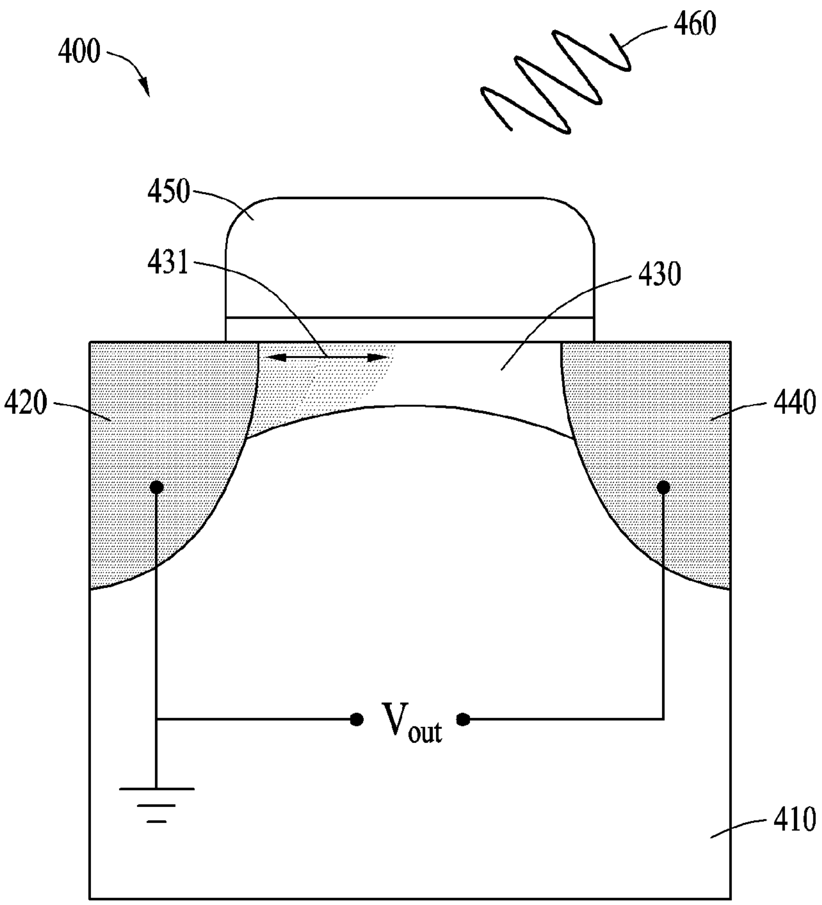
FIG. 4 is a diagram illustrating a process of detecting an incident terahertz wave as a direct current (DC) voltage by a field-effect transistor according to an example embodiment.

FIG. 4 is a diagram illustrating a process of detecting an incident terahertz wave as a DC voltage by a field-effect transistor according to an example embodiment.

According to an example embodiment, a field-effect transistor 400 may include a silicon substrate 410, a source 420, a channel region 430, a drain 440, and a gate 450, and a terahertz wave 460 may be applied to the gate 450.

To detect, as a DC voltage, a terahertz wave which is an alternating current (AC) signal incident on a field-effect transistor, charge asymmetry of a 2D form may be required in the channel region 430 of the field-effect transistor 400. For a source-drain asymmetry condition viewed from the gate 450 on which the terahertz wave 460 is incident, a structural asymmetry condition may be required between the source 420 and the drain 440. In the field-effect transistor 400, an asymmetry effect between the source 420 and the drain 440 may be maximized through a width $L_g$ of the channel region 430.

Referring back to FIG. 3, a virtual center 321 of the source 320 and a virtual center 331 of the channel region 330 may be separate from each other when viewed in a direction vertical to the silicon substrate of the field-effect transistor 300, and the structural asymmetry condition between the source 320 and the drain 340 may be satisfied. In the field-effect transistor 300, a value of L and a value of $L_g$ may differ from each other. That is, the field-effect transistor 300 may have an asymmetrical structure in which an arrival distance of charges from the source 320 toward the drain 340 may change from $L_g$ to L, and this asymmetry may strengthen an electric field between the gate and the source 320 of the field-effect transistor 300. In other words, the field-effect transistor 300 may detect a terahertz wave as a DC voltage through the asymmetrical source-drain structure in which the virtual center 321 of the source 320 and the virtual center 331 of the channel region 330 are eccentric.

Specifically, referring to FIG. 4, when the terahertz wave 460 is applied to the field-effect transistor 400, charges may be generated in the channel region 430, and the charges may be distributed intensively in a portion adjacent to the source 420. In this case, the charges may be intensively distributed in the portion adjacent to the source 420 by the terahertz wave 460, and be relatively less distributed in a portion adjacent to the drain 440. Thus, charge asymmetry may occur between the source 420 and the drain 440. Through this charge asymmetry, the field-effect transistor 400 may detect the terahertz wave 460 by a difference in voltage between the source 420 and the drain 440. To implement the charge asymmetry in the field-effect transistor 400, a width of the channel region 430 may need to exceed a charge density distribution length 431 corresponding to a region in which the charges are distributed. That is, the width of the channel region 430 may be a length exceeding the charge density distribution length 431 generated in response to the application of the terahertz wave 460 to the field-effect transistor 400. That a width $L_g$ of a channel region exceeds a charge density distribution length may be a boundary condition for detecting, by a field-effect transistor, a terahertz wave based on a potential difference between a source and a drain. However, when the width of the channel region increases, the resistance of the channel region in the field-effect resistor increases, and thus the channel region may need to have a desirable width.

Thus, a width of a drain in a field-effect transistor (e.g., the field-effect transistor 300) may be determined based on a first performance parameter associated with a terahertz wave reception rate of the field-effect transistor, and a width of a channel region in the field-effect transistor may be determined based on a second performance parameter associated with the detection of a terahertz wave to be received by the field-effect transistor independently of the first performance parameter.

According to an example embodiment, a field-effect transistor may be integrated along with peripheral circuit components, for example, a signal receiver and an amplifier, for additional performance improvement, and may provide a simple integral transistor-antenna structure even for a multi-pixel configuration for real-time and large area, thereby enabling a low-cost and commercial-grade performance terahertz imaging system.

Figure 5:
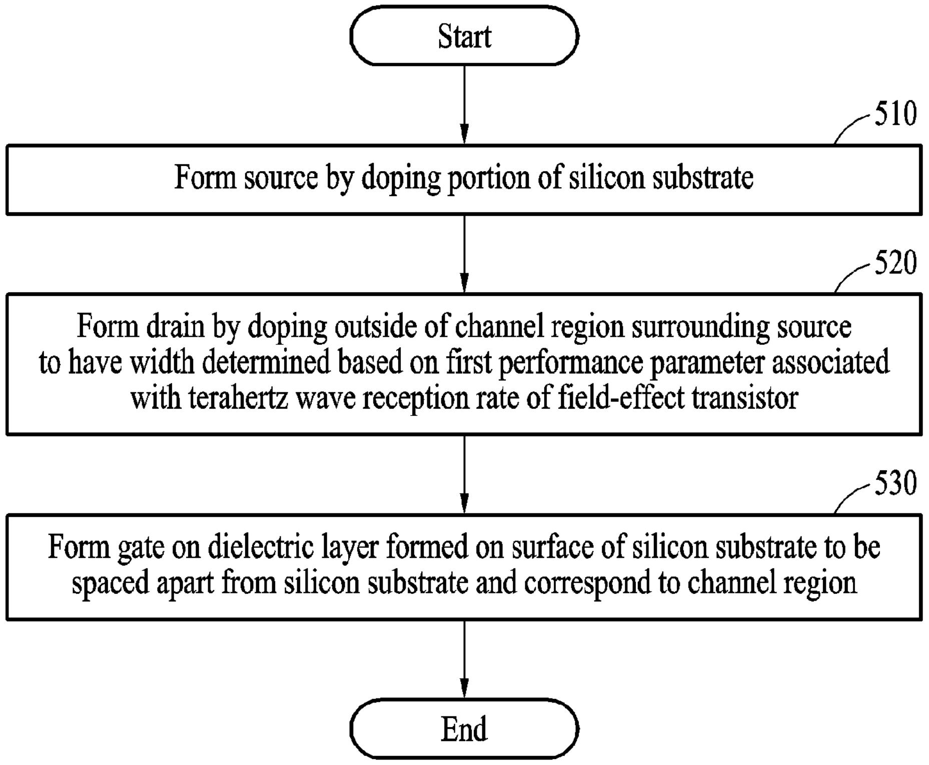
FIG. 5 is a flowchart illustrating a method of manufacturing a field-effect transistor according to an example embodiment.

FIG. 5 is a flowchart illustrating a method of manufacturing a field-effect transistor according to an example embodiment.

In operation 510, a method of manufacturing a field-effect transistor for terahertz wave detection using a gate as an antenna (hereinafter simply a field-effect transistor manufacturing method) may form a source by doping a portion of a silicon substrate.

In operation 520, the field-effect transistor manufacturing method may form a drain by doping an outside of a channel region provided in a form surrounding the source such that the drain has a width determined based on a first performance parameter associated with a terahertz wave reception rate of the field-effect transistor. Here, the channel region may have a width determined based on a second performance parameter associated with the detection of a terahertz wave to be received by the field-effect transistor. In this case, the drain may be formed such that a center of the source and a center of the channel region are separate from each other. The width of the drain may be determined based on the first performance parameter, and the width of the channel region may be determined only by the second performance parameter independently of the first performance parameter.

In operation 530, the field-effect transistor manufacturing method may form a gate to be spaced apart from the silicon substrate and correspond to the channel region, on a dielectric layer formed on a surface of the silicon substrate. In this case, the gate may be formed to cover the channel region when viewed in a direction vertical to the silicon substrate. In addition, the gate may be formed to partially overlap the source and the drain when viewed in the direction vertical to the silicon substrate.

Further, according to an example embodiment, the field-effect transistor manufacturing method may dope the drain such that the width of the drain becomes a length corresponding to one of a target wavelength corresponding to a target terahertz wave of the field-effect transistor, ½ of the target wavelength, and ¼ of the target wavelength. According to another example embodiment, the field-effect transistor manufacturing method may dope the drain such that the width of the channel region becomes a length exceeding a length of a charge density distribution generated in response to the application of a terahertz wave to the field-effect transistor.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A field-effect transistor for terahertz wave detection using a gate as an antenna, comprising:

a silicon substrate comprising a source, and a drain formed outside a channel region provided in a form surrounding the source; and a gate formed to be spaced apart from the silicon substrate and correspond to the channel region, on a dielectric layer formed on a surface of the silicon substrate, wherein the drain has a width determined based on a first performance parameter associated with a terahertz wave reception rate of the field-effect transistor, the channel region has a width determined based on a second performance parameter associated with detection of a terahertz wave to be received by the field-effect transistor, the width of the drain is determined based on the first performance parameter, the width of the channel region is determined only by the second performance parameter independently of the first performance parameter, a center of the source and a center of a circle corresponding to a circumference of the channel region are off-centered from each other, and a shortest distance from the source to the drain is different from a longest distance from the source to the drain.

2. The field-effect transistor of claim 1, wherein, when viewed in a direction vertical to the silicon substrate, the source is in a circular form, the channel region is in a ring form, and the drain is in a ring form.

3. The field-effect transistor of claim 1, wherein, when viewed in a direction vertical to the silicon substrate, the gate is formed to cover the channel region.

4. The field-effect transistor of claim 1, wherein the width of the channel region is a length equal to a shortest distance from the source to the drain.

5. The field-effect transistor of claim 1, wherein the width of the drain is a length corresponding to one of a target wavelength corresponding to a target terahertz wave of the field-effect transistor, ½ of the target wavelength, and ¼ of the target wavelength.

6. The field-effect transistor of claim 1, wherein the width of the channel region is determined based on a width of the source and a width of the gate.

7. The field-effect transistor of claim 1, wherein the width of the channel region is a length exceeding a length of a charge density distribution generated in response to application of a terahertz wave to the field-effect transistor.

8. The field-effect transistor of claim 1, wherein, when viewed in a direction vertical to the silicon substrate, the gate partially overlaps the source.

9. The field-effect transistor of claim 1, wherein, when viewed in a direction vertical to the silicon substrate, the gate partially overlaps the drain.

* * * * *